(12) United States Patent
Estlander

(10) Patent No.: US 8,033,418 B2
(45) Date of Patent: Oct. 11, 2011

(54) SEALED CHASSIS, A SEAL AND METHOD OF ASSEMBLING AND DISASSEMBLING A SEALED CHASSIS

(75) Inventor: Peter Estlander, Malmo (SE)

(73) Assignee: Sony Ericsson Mobile Communications AB, Lund (SE)

( * ) Notice: Subject to any disclaimer, the term of this patent is extended or adjusted under 35 U.S.C. 154(b) by 709 days.

(21) Appl. No.: 11/813,166

(22) PCT Filed: Dec. 15, 2005

(86) PCT No.: PCT/EP2005/013677
§ 371 (c)(1),
(2), (4) Date: Apr. 11, 2008

(87) PCT Pub. No.: WO2006/069666
PCT Pub. Date: Jul. 6, 2006

(65) Prior Publication Data
US 2008/0264956 A1    Oct. 30, 2008

Related U.S. Application Data

(60) Provisional application No. 60/643,376, filed on Jan. 12, 2005.

(30) Foreign Application Priority Data

Dec. 30, 2004  (EP) .................................. 04388097

(51) Int. Cl.
*B65D 6/32* (2006.01)
(52) U.S. Cl. ........................................ 220/678; 156/325
(58) Field of Classification Search .................. 220/662, 220/663, 678, 677, 612, 610, 4.02, 4.24, 220/4.21, 660, 600, 4.01, 676; 156/325; 361/679.01, 600; 174/520
See application file for complete search history.

(56) References Cited

U.S. PATENT DOCUMENTS

| 5,775,510 | A  | * | 7/1998  | Hodges .......................... 206/724 |
| 6,355,316 | B1 |   | 3/2002  | Miller et al. |
| 6,852,924 | B2 | * | 2/2005  | Lessard ........................... 174/50 |
| 2002/0039658 | A1 |   | 4/2002  | Bunyan et al. |
| 2002/0112870 | A1 |   | 8/2002  | Kobayashi et al. |
| 2004/0263713 | A1 | * | 12/2004 | Takata et al. .................... 349/58 |

FOREIGN PATENT DOCUMENTS

| GB | 2 115 084 A | 9/1998 |
| JP | 02-058398 | 2/1990 |
| JP | 04-011679 | 1/1992 |
| JP | 03318790 | 11/1994 |
| JP | 2002-251769 | 9/2002 |
| RU | 2 248 023 | 3/2005 |

* cited by examiner

*Primary Examiner* — Anthony Stashick
*Assistant Examiner* — Robert J Hicks
(74) *Attorney, Agent, or Firm* — Myers Bigel Sibley & Sajovec

(57) ABSTRACT

A chassis includes two or more chassis parts that include sets of interconnecting structures. The chassis forms a closed space the chassis parts and a sealing structure sealingly connects the chassis parts. The sealing structure includes a light receiving window formed in the chassis, a light-sensitive glue, and a light guide formed within the chassis adapted for passing light from the light receiving window to the light-sensitive glue. The light sensitive glue is provided between the chassis parts and/or between at least one of the chassis parts and the light guide.

16 Claims, 4 Drawing Sheets

US 8,033,418 B2

SEALED CHASSIS, A SEAL AND METHOD OF ASSEMBLING AND DISASSEMBLING A SEALED CHASSIS

RELATED APPLICATIONS

The present application is a 35 U.S.C. §371 national phase application of PCT International Application No. PCT/EP2005/013677, having an international filing date of Dec. 15, 2005 and claiming priority to European Patent Application No. 04388097.0, filed Dec. 30, 2004 and U.S. Provisional Application No. 60/643,376 filed Jan. 12, 2005, the disclosures of which are incorporated herein by reference in their entireties. The above PCT International Application was published in the English language and has International Publication No. WO 2006/069666.

TECHNICAL FIELD

The invention relates to a chassis comprising two or more chassis parts; a closed space formed between said parts, said parts comprising sets of corresponding interconnection means; and sealing means, sealingly connecting said parts.

The invention further relates to a seal formed between two parts of a chassis, said parts forming a closed space between them, said parts comprising sets of interconnection means.

The invention further relates to a method of assembling and disassembling a sealed chassis comprising at least two chassis parts; a closed space formed between said parts, said parts comprising sets of corresponding interconnection means; and sealing means, sealingly connecting said parts.

RELATED PRIOR ART

Mobile handheld telecommunication devices and the like comprising a housing constituting a shield for electrical and mechanical components enclosed in the housing are susceptible to impacts due to their portable use, that might cause damage to the interior functional components. Therefore the housing of such devices needs to be openable, such that access to the interior components may be achieved, in order to repair the device or replace components, etc. Therefore such housings usually comprises two or more releasably interconnected parts. However, it is highly undesirable that unskilled persons acquire access to the interior functional components.

Thus, there is a need for a device that cannot be opened by unauthorized/unskilled persons. A typical way of connecting the parts of a housing is by using sealing means in the form of screws between the housing parts. Such screws can be made "tamper-proof" or at least hard to remove, by providing an unconventional notch in the head of the screw that needs specialized tools to screw/unscrew. However, when used multiple times the notch of such screws tend to be damaged, whereby access to the interior of the chassis is prevented or impeded. Also, such screws or other mechanical devices tend to get lost when removed from the chassis.

Also it is known to connect the parts of a housing by gluing them together, or by various mechanical connection mechanisms, e.g. snap locks, provided between the parts. Using glues or permanent mechanical connections means to seal a chassis, prevents or seriously impedes the authorized as well as the undesired unauthorized access to the interior of the chassis without possible damage to the chassis, or possibly to the interior sealed off components also.

Different types of glue are known. Some types of glue cure when exposed to particular wavelengths of light, typically in the ultraviolet (UV) range. One type of glue is capable of curing by exposure to light at one wavelength and dissolving by exposure to light at another wavelength. The curing wavelength is in the ultraviolet (UV) range, and the dissolving wavelength is in the infrared (IR) range. Such a glue has e.g. been used in the field of workbenches. The workbench is in an area provided with light guides in the form of ceramic taps. An metallic object to be processed on the workbench is fastened to the workbench by applying a portion of the glue between the object an the ceramic taps and UV-light is applied through the light guide whereupon the glue will cure. When the work process on the object is done, the object can be removed from the workbench by applying light in the IR-range to the glue through the light guide. This is known from a paper "Klister erstätter skuvstycke" dated Aug. 25, 2004 in the Swedish periodical "Ny Teknik".

OBJECT OF THE INVENTION

It is an object of the present invention to provide an improved and/or alternative way of sealing a chassis, especially such a chassis that is used for electronic equipment such as portable radio communication devices or other applications where internal electronic components needs to be held out of reach of unauthorized persons and/or persons who are not sufficiently skilled, and who may therefore damage the internal electronic components or may themselves be hurt by contact with the components. It is also an object of the present invention to provide an improved sealed chassis and an improved seal.

The inventor has realized that light-sensitive glue can advantageously be used to provide a seal, a sealed chassis and a method of sealingly assembling/disassembling a chassis.

SUMMARY OF THE INVENTION

The object of the invention is achieved by a chassis comprising two or more chassis parts, said parts comprising sets of interconnection means; a closed space formed between said parts; and sealing means for sealingly connecting said parts, where the sealing means comprise a light receiving window formed in said chassis, a light-sensitive glue; and a light guide formed within said chassis which light guide is adapted for passing light from the light receiving window to the light-sensitive glue, and where the light-sensitive glue is provided between said parts, or between at least one of the chassis parts and the light guide.

The light-sensitive glue in one embodiment is of the type that dissolves by exposure to light at first wavelength.

The light-sensitive glue in another embodiment is of the type that cures by exposure to light at a second wavelength.

In a further embodiment the light guide is formed along an internal periphery of the interconnection means of said parts.

In a further embodiment the light-sensitive glue is applied in a groove formed in at least one of said the interconnection means.

In a further embodiment the light guide is formed with at least one flange 34 adapted to extend into said groove.

In a further embodiment the light guide is formed entirely in one of said chassis parts.

In a further embodiment the light guide is formed by said light-sensitive glue.

In a further embodiment the chassis is the that of a portable radio communication equipment.

The object of the invention is further achieved by a seal formed between two or more parts of a chassis, the chassis parts forming a closed space between them, the parts comprising sets of interconnection means, the seal comprising a light receiving window formed in said chassis; a light-sensitive glue; and a light guide formed within the chassis, the light guide being adapted for passing light from said light receiving window to said light-sensitive glue, and where said light-sensitive glue is provided between said parts, or between at least one of said parts and said light guide.

In one embodiment the light-sensitive glue dissolves by exposure to light at first wavelength.

In another embodiment the light-sensitive glue cures by exposure to light at a second wavelength.

In a further embodiment the light guide is formed by said light-sensitive glue.

The object of the invention is further achieved by a method of assembling and disassembling a sealed chassis comprising two or more chassis parts; a closed space formed between said parts, the parts comprising sets of corresponding interconnection means; and sealing means, where the sealing means comprises a light receiving window formed in said chassis; a light-sensitive glue; and a light guide formed within said chassis, the light guide being adapted for passing light from the light receiving window to the light-sensitive glue where the light-sensitive glue is applied between said chassis parts or between at least one of said parts and said light guide in a first step, the glue is cured and thereby forms a durable seal in the second step; and light at a first wavelength is applied to the light-sensitive glue through said light window, thereby dissolving the glue for disassembling the chassis in a third step.

In one embodiment the light-sensitive glue is cured by exposure to light at a second wavelength.

In one embodiment the light is passed through a light guide constituted by a light-sensitive glue.

The term light guide in the following will be understood as a formation of material capable of guiding light.

The term chassis will be understood as a set of surfaces arranged such that they enclose a space between them, and such that the access to this space is restricted from outside the chassis. The surfaces may comprise openings adapted for inserts that closes said surfaces. Such inserts may comprise means for communicating with electronic components arranged in said closed space, e.g. LCD displays, pushbuttons, and electrical plugs.

The term "closed space" in conjunction with "chassis" will be understood as a space that is inaccessible to manual handling by means of hand or tool without damaging the chassis.

It should be emphasized that the term "comprises/comprising" when used in this specification is taken to specify the presence of stated features, integers, steps or components but does not preclude the presence or addition of one or more other features, integers, steps, components or groups thereof.

The term electronic equipment includes portable radio communication equipment. The term portable radio communication equipment, which herein after is referred to as a mobile radio terminal, includes all equipment such as mobile telephones, pagers, communicators, i.e. electronic organizers, smartphones or the like.

DESCRIPTION OF THE DRAWINGS

The invention will be described in detail in the following with reference to the drawings in which.

DETAILED DESCRIPTION OF EMBODIMENTS OF THE INVENTION

Figure 1:
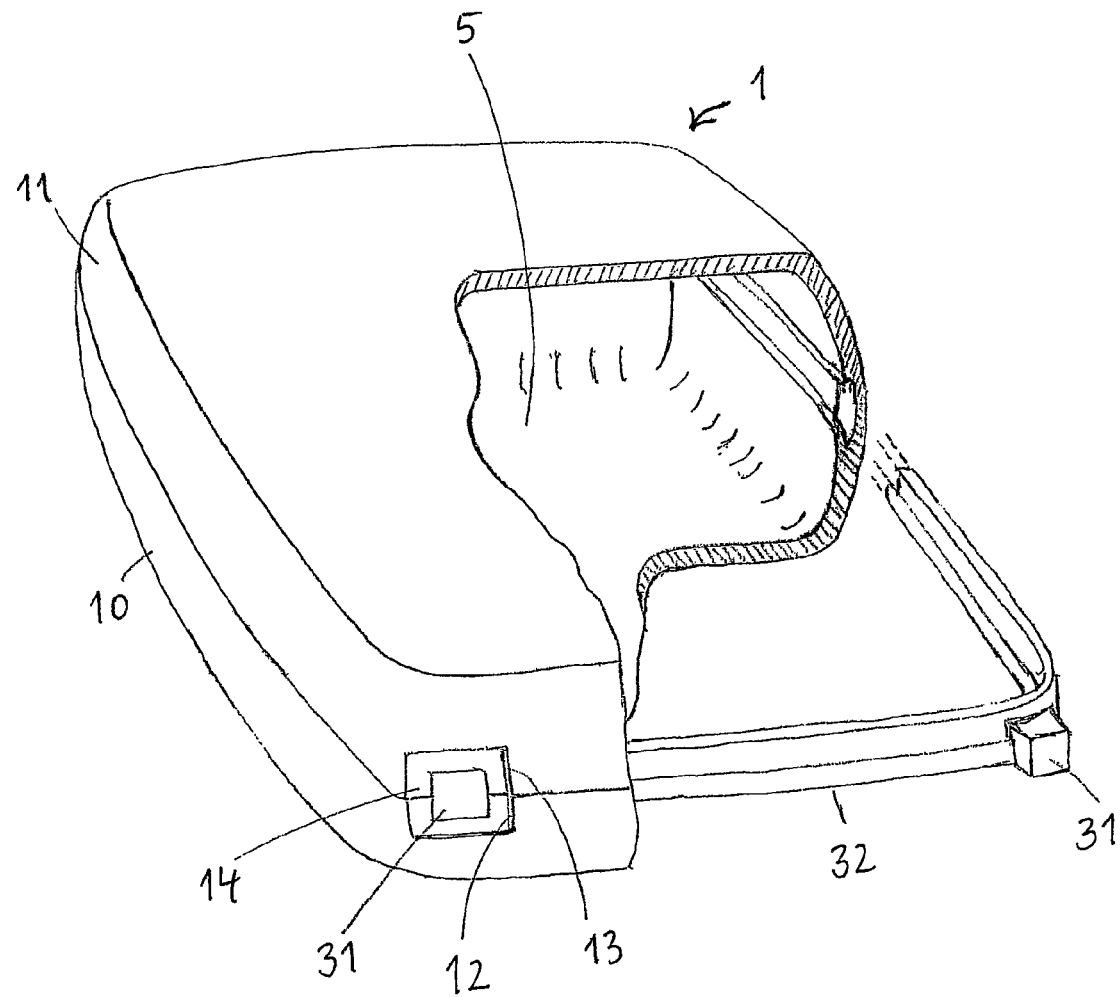
FIG. 1 is a partly sectional perspective view of a chassis according to an embodiment of the invention.

In FIG. 1 a chassis 1 according to one embodiment of the invention is shown, the chassis 1 comprising two chassis parts 10, 11, an upper part 11 and a lower part 10. Between the parts 10, 11 of the chassis 1 a closed space 5 is formed. This closed space 5 may preferably house electronic components (not shown), that need to be sealed off, in order to avoid unauthorized access to/tampering with these components.

A lower part 10 comprises a bottom surface, and a set of sidewalls. Correspondingly, an upper part 11 comprises a top surface, and a set of sidewalls. Each of the parts 10, 11 are adapted with interconnection means 20, 21 provided on flanges 40, 41, respectively (see FIGS. 2A, 2B and 2D) of the sidewalls for joining the two parts 10, 11, the respective interconnection means 20, 21 being adopted to cooperate with each other by abutment. The interconnection means 20, 21 are preferably opposed surfaces as can be appreciated from FIG. 2A.

Sealing means are formed in connection to the respective interconnection means 20, 21 for sealingly connecting said parts 10 and 11.

These sealing means comprise a light guide 32 having light windows 31, formed integrally with the light guide 32. The light windows 31 and the parts 10, 11 of the chassis 1 are formed such that the light windows 31 can be accessed/are visible from outside the chassis 1. In the embodiment shown in FIG. 1 corresponding indentions 12, 13 are formed in the respective parts 10, 11 in order to form areas 14 on the chassis 1 around the light windows 31 adapted for receiving a cover or a label (not shown), such that light can be prevented from unintentionally entering the light guide 32 through the light window 31. The indentions 12, 13 can be formed in the respective chassis parts 10, 11 by a reduced materiel thickness of the wall of the chassis part 10, 11 in those regions. The label or cover over the area 14 will further aid in hiding the intended tamper sealing function of the light window 31, and provide a smooth outer surface that constitutes an appealing esthetic appearance. The label or cover can be easily removable by hand, and can e.g. be glued on the chassis using a conventional glue or snapped into the indented area 14.

Figure 2A:
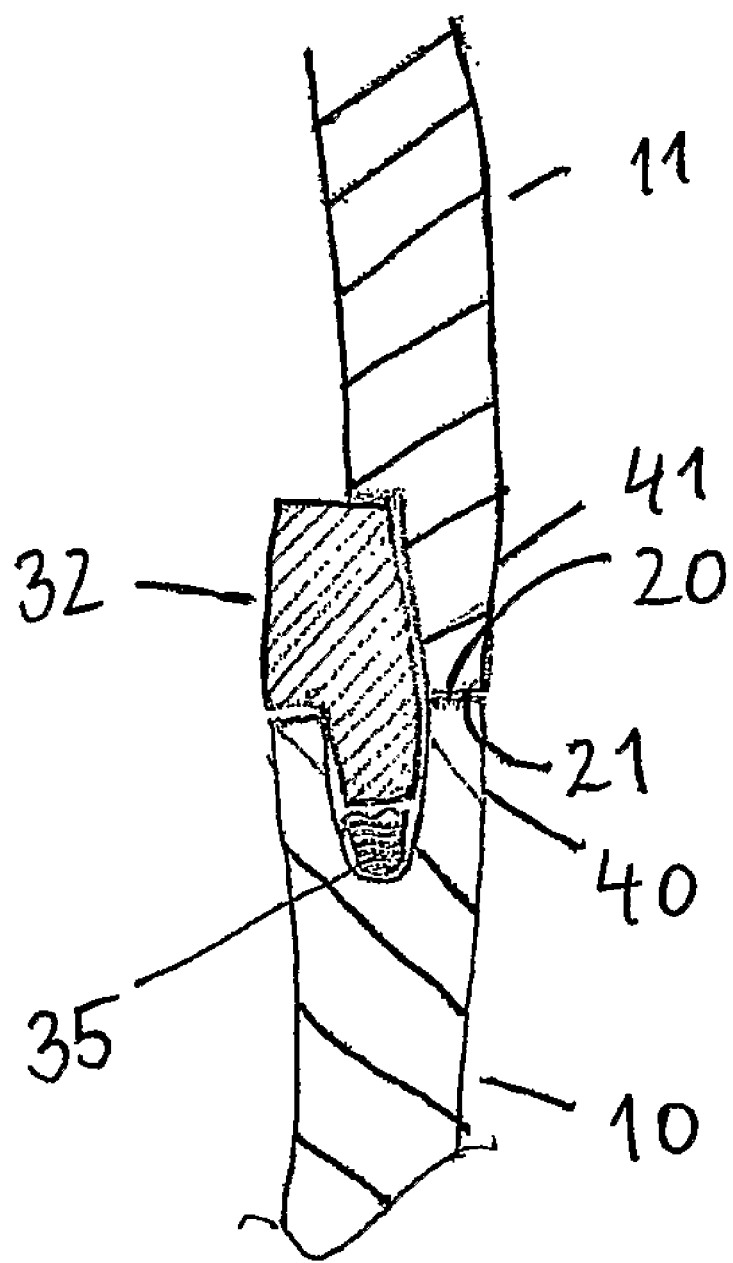
FIG. 2A shows a detailed partial section through the chassis shown in FIG. 1.
Figure 2D:
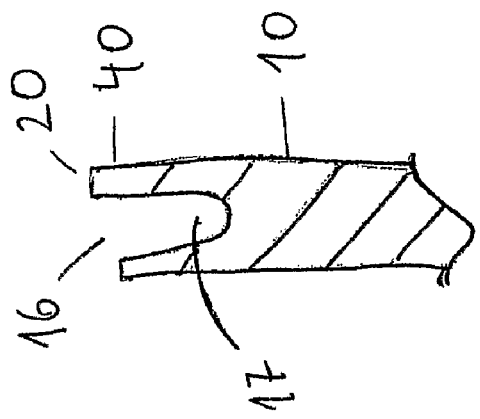
FIG. 2D shows details of a lower chassis part shown in FIG. 2A.
Figure 2C:
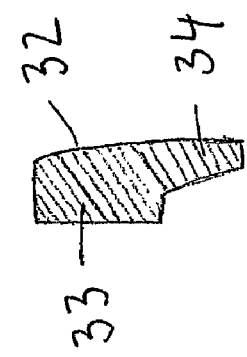
FIG. 2C shows details through a light guide of a seal of the chassis shown in FIG. 2A.
Figure 2B:
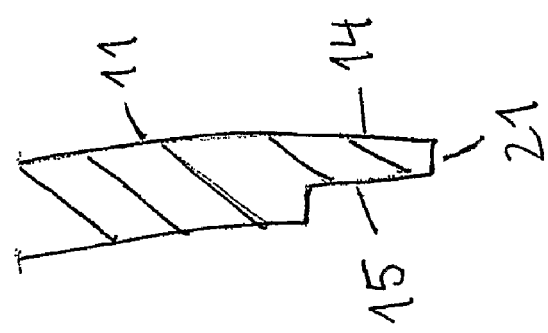
FIG. 2B shows details of a lower chassis part of the chassis shown in FIG. 2A.

The light guide 32 in some embodiments extends along and on the inside of the inner periphery of the interconnection structures 20, 21 of the side walls of the chassis parts 10, 11. As illustrated in FIGS. 2A and 2C, a body part 33 of the light guide 32 may be joined to the inner periphery 15 of the side walls of the upper chassis part 11. In some embodiments, this joint may be a permanent joint. A permanent joint may be accomplished in a variety of ways that may include, for example, a conventional non light-sensitive glue, a groove and tongue connection, a snap connection, taps, welding, and/or in any other way known in the art. In some embodiments, the joint between the light guide 32 and inner periphery 15 of the side walls of the upper chassis part 11 may be non-permanent, but inaccessible from the outside of the chassis 1.

In the periphery 16 of the lower cover part 10 a glue groove 17 is formed in the entire circumference of the side walls.

The light guide 32 is formed with a flange 34 extending from said body part 33, said flange 34 being adapted to fit at least partly into groove 17, such that a void remains in the groove 17 between the bottom of the groove 17 and the flange 34. A portion of light-sensitive glue 35 fills the void, thus fastening the lower part 10 to the light guide 32, which again is joined to the upper part 11, as described above. Thus the light-sensitive glue 35 forms a part of the sealing means.

The flanges 40, 41 of the chassis parts also prevent light from entering into the chassis 1.

In the embodiment described above, and as shown in FIG. 1, the light guide 32 is formed in the entire interconnection area between the two parts 10, 11. However, the light guide 32 may be formed only in parts of the interconnection area between the two parts 10, 11, such that the sealing is provided only in zones or sections.

Figure 3:
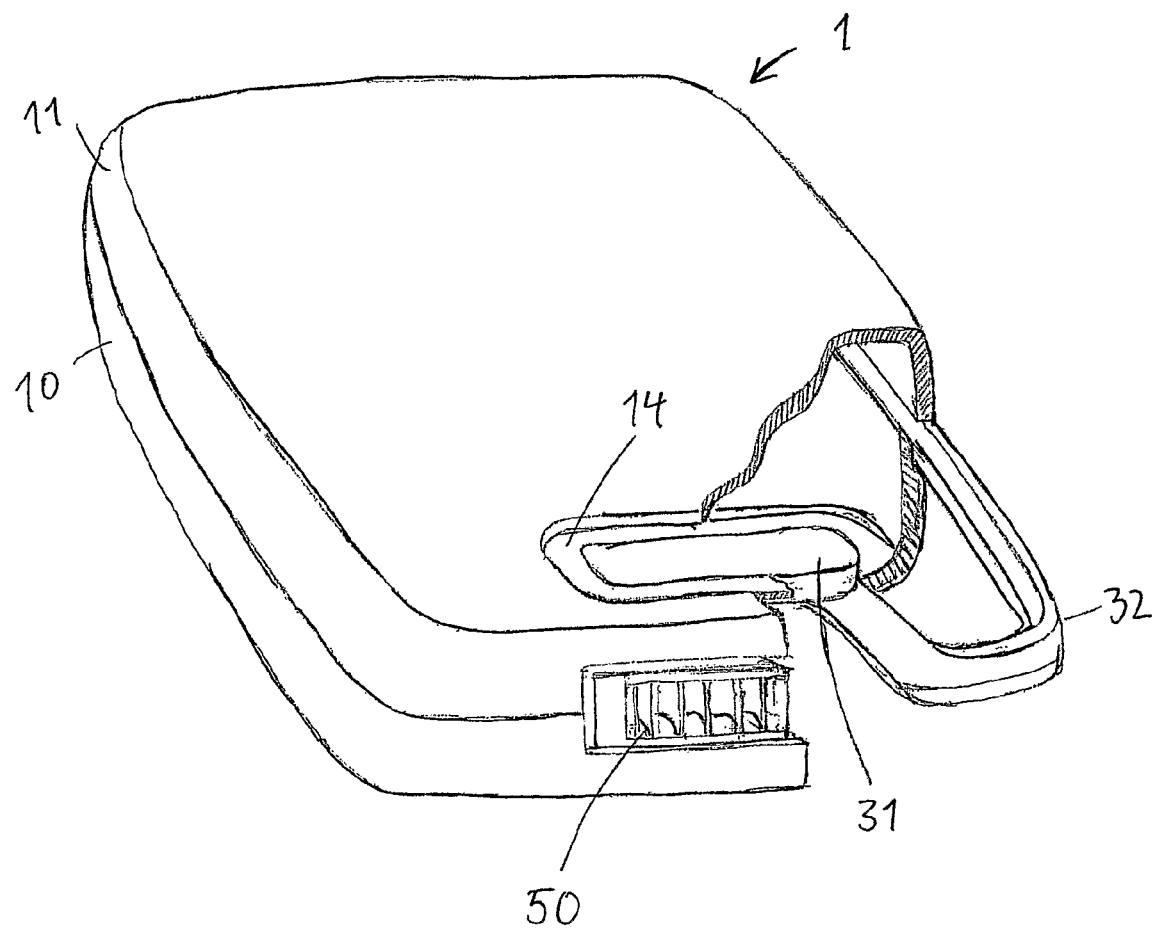
FIG. 3 is a partly sectional perspective view of a chassis according to another embodiment of the invention.

In another embodiment as shown in FIG. 3, a light window 31 of a light guide 32 is formed such that it is accessible through a top chassis part 11 only, such that at least in one area the connection area between the two parts 10, 11 is free of the sealing means. Also the groove 17 may not extend around the entire periphery 16 of the lower part 10. Thus this area can be utilized for providing means that closes the chassis but allows communication with the interior components. In FIG. 3 a jack 50 e.g. for charging a battery enclosed in the chassis 1 is indicated.

In FIG. 3 an indented region 14 surrounding light window 31 is shown. Again this region/area is adapted for placement of a label or cover for preventing accidental disposure of light to the light window 31.

The chassis 1 may be constructed from more than two parts. In FIGS. 1 and 3 the chassis are formed by two parts of approximately equal size. However, the parts may be of different relative sizes, e.g. such that one relatively smaller part forms a door in a larger part. Also, the parts may, in addition to the above mentioned sealing means, comprise other additional mechanical connection means, such as hinges.

The seal in the chassis may comprise more than one light guide, each light guide 32 being formed in communication with a light window 31 and at least one portion of light-sensitive glue 35 connecting a set of interconnecting means 20, 21, or the interconnecting means and said light guide 32.

In a chassis comprising more than two chassis parts more than one seal may be provided for sealing the parts, each seal comprising at least one light window and one portion of light-sensitive glue.

The light guide is preferably formed in glass, a polymer material (plastic) or in a ceramic material suitable for conducting light.

The chassis may also be formed with a light guide 32 running entirely within a single part 10, 11, the light guide thus running from a light window 31 to a point where two chassis parts 10, 11 are connected, at which a portion of light-sensitive glue is provided. Further, the light guide 32 may split so that from a single light window 31 several interconnection points of the chassis parts 10, 11 may be reached.

The chassis 1 is specially suitable for portable radio communication equipment, but may advantageously be used in connection with any situation where there is a need for sealing a closed space.

The chassis 1 may have a removable cover or part that provides access to a second space inside the chassis, which second space is adapted for containing components that can safely be accessible to the above mentioned unauthorized person, e.g. the user of a portable radio communication equipment, such as a mobile phone. Such a mobile phone has a second internal space that holds a battery and a SIM card. The battery and SIM card can safely be replaced by the everyday user of the phone. Thus the second space is accessible for the unskilled/unauthorized user, but isolated from the internal inaccessible space 5.

The light guide 32 and the chassis 1 may be formed such that one or more light windows 31 are accessible from inside such a second non-sealed space of the chassis 1, e.g. the battery compartment of a mobile telephone. Again such a light window 31 may comprise a removable label or cover.

In another embodiment (not shown), the periphery of both chassis parts 10, 11 are provide with grooves 17, and correspondingly the light guide 32 is provided with two opposite flanges 34, such that portions of light-sensitive glue 35 can be arranged between the light guide and each of said parts 12, such that the chassis parts are each sealed to the light guide 32, and thereby to each other. Alternatively, a groove similar to groove 17 in the lower chassis part 10 of FIG. 2D can be arranged in the light guide 32 opposite the flange 34, and correspondingly, a flange similar to flange 34 of the light guide 32 in FIG. 2C can be arranged on the upper chassis part 11, for can be obtaining the same effect.

The enclosed space 5 of the chassis 1 may be subdivided in several compartments.

During assembly of the chassis 1 a light-sensitive glue is applied to the groove 17 of lower chassis part 10. Then the assembly comprising the light guide 32 and the other chassis part 11 is mounted on the lower chassis part 10, the flange 34 of the light guide 32 extending into the groove 17, such that the glue is dispersed over the sides of groove 17 and flange 34. Then light at a second wavelength, e.g. light in the UV-range is applied to the light guide 32 through light window 31, by pointing a suitable light source to the light window 31. The light passes through the light guide 32 to the light sensible glue, which will cure.

Subsequently, the light window 31 may be covered by a label or cover (not shown).

Thus, a sealed space 5 is formed inside the chassis, inaccessible to an unauthorized person, or at least to a person without the right skills and light emitting equipment.

If for some reason access needs to be provided to the sealed space 5, e.g. in order to repair the content of the sealed space 5, the chassis 1 may be disassembled by removing the label/cover from the light window 31, if such label/cover is present, then pointing a suitable light source to the light window 31, the light source be capable of emitting light at a first wavelength, preferably in the IR-range. The light passes through the light guide 32, and into the light-sensitive glue, which will then dissolve, allowing the chassis parts 10, 11 to be taken apart, thus providing access to the interior sealed space 5 within the chassis 1.

After the disassembly of the chassis 1 and the repair of its contents, the chassis 1 may be assembled again, either by using the same glue, or possibly by adding a new layer of light-sensitive glue.

Thus, in the above mentioned method of assembly/disassembly of the chassis a light-sensitive glue is used, that is cured by exposure to light at a second wavelength and dissolves by exposure to light at a first second wavelength. Second wavelength is preferably in the UV-range, and first wavelength is preferably in the IR-range.

Possibly, glues curable and or dissolvable at other ranges of wavelength can be perceived. Such glues may easily be adapted to the chassis, the seal and the method of the present invention.

However in another embodiment of the invention a light-sensitive glue can be utilized, that dissolves by exposure to light at a particular first wavelength, but cures like conventional glue by "drying up" by evaporating or by two component reaction. Thus the step of passing light to the glue to seal the chassis 1 can be left out, but the sealed chassis 1 can be reopened for repairs and sealed again as described above.

In all of the above embodiments the light guide may be formed in glass, in a light permeable ceramic material or in a light permeable plastic material, e.g. a polycarbonate.

In another embodiment of the invention the light guide 32 may be formed by a light-sensitive glue 35, that is capable of conducting/transmitting light in its dissolved as well as its cured state. This glue may be applied as a paste connecting to each chassis part 10, 11. In the case the light guide 32 is constituted by a light-sensitive glue, the light window should preferably be formed separately from the glue light guide in the chassis 1.

In an alternative embodiment one or more light emitting sources may be provided inside the chassis for providing light at the first and/or the second wavelength in order to cure and/or dissolve the light-sensitive glue. This light source can be electronically activated from the outside of the chassis, e.g. by radio communication or by a code typed in a keypad formed in the outer surface of the chassis.

In all embodiments the chassis parts are preferably formed in a plastic material, a metal or a combination thereof.

The invention claimed is:

1. A chassis, comprising:
   a plurality of chassis parts configured to form a closed space therebetween, the plurality of chassis parts comprising interconnecting structures; and
   a sealing structure for sealingly connecting the chassis parts,
   wherein the sealing structure comprises:
   a light receiving window formed in the chassis;
   a light-sensitive glue; and
   a light guide formed within the chassis, the light guide adapted for passing light from the light receiving window to the light-sensitive glue, wherein the light-sensitive glue is provided between the plurality of chassis parts and/or between at least one of the plurality of chassis parts and the light guide.

2. A chassis according to claim 1, wherein the light-sensitive glue dissolves by exposure to light at a first wavelength.

3. A chassis according to claim 2, wherein the light-sensitive glue cures by exposure to light at a second wavelength.

4. A chassis according to claim 1, wherein the light guide is formed along an internal periphery of the interconnecting structures of the plurality of chassis parts.

5. A chassis according to claim 1, wherein at least one of the interconnecting structures comprises a groove configured to receive the light-sensitive glue.

6. A chassis according to claim 5, wherein the light guide comprises at least one flange adapted to extend into the groove.

7. A chassis according to claim 1, wherein one of the plurality of chassis parts comprises the light guide.

8. A chassis according to claim 1, wherein the light guide is formed using the light-sensitive glue.

9. A chassis according to claim 1, wherein the chassis comprises a portable radio communication equipment chassis.

10. A seal formed between a plurality of parts of a chassis, the plurality of parts configured to form a closed space between them, the plurality of parts comprising interconnection structures, the seal comprising:
    a light receiving window formed in the chassis;
    a light-sensitive glue; and
    a light guide formed within the chassis, the light guide adapted to pass light from the light receiving window to the light-sensitive glue,
    wherein the light-sensitive glue is provided between the plurality of parts and/or between at least one of the plurality of parts and the light guide.

11. A seal according to claim 10, wherein the light-sensitive glue dissolves by exposure to light at a first wavelength.

12. A seal according to claim 11, wherein the light-sensitive glue cures by exposure to light at a second wavelength.

13. A seal according to claim 10, wherein the light guide is formed by the light-sensitive glue.

14. A method of assembling and disassembling a sealed chassis, the method comprising:
    forming a closed space between two or more chassis parts comprising sets of corresponding interconnection structures;
    applying a light sensitive glue between the chassis parts and/or between at least one of the chassis parts and a light guide formed within the chassis, wherein the light guide is adapted for passing light from a light receiving window formed in the chassis to the light sensitive glue;
    sealing the closed space using the light-sensitive glue, wherein the light sensitive glue is configured to cure and form a durable seal; and
    dissolving the light sensitive glue by applying light at a first wavelength to the light-sensitive glue through the light window.

15. A method according to claim 14, wherein sealing the closed space comprises curing the light-sensitive glue via exposure to light at a second wavelength.

16. A method according to claim 14, further comprising passing the light through the light guide constituted by the light-sensitive glue.

* * * * *